United States Patent [19]

Wang et al.

[11] Patent Number: 5,219,485
[45] Date of Patent: Jun. 15, 1993

[54] MATERIALS AND METHODS FOR ETCHING SILICIDES, POLYCRYSTALLINE SILICON AND POLYCIDES

[75] Inventors: David N. Wang, Cupertino; Mei Chang, San Jose; T. K. Leong, deceased, late of Santa Clara, all of Calif.; Peter P. Leong, executor, Vancouver, Canada

[73] Assignee: Applied Materials, Inc., Santa Clara, Calif.

[21] Appl. No.: 778,326

[22] Filed: Oct. 17, 1991

Related U.S. Application Data

[60] Division of Ser. No. 443,811, Nov. 29, 1989, Pat. No. 5,112,435, which is a continuation of Ser. No. 185,256, Apr. 19, 1988, abandoned, which is a continuation of Ser. No. 786,783, Oct. 11, 1985, abandoned.

[51] Int. Cl.$^5$ .................................... H01L 21/302
[52] U.S. Cl. ...................... 252/79.3; 156/643; 156/646; 156/656; 156/657; 156/662
[58] Field of Search ............... 156/643, 646, 656, 657, 156/662; 252/79.3

[56] References Cited

U.S. PATENT DOCUMENTS

| | | | |
|---|---|---|---|
| 3,951,709 | 4/1976 | Jacob | 156/643 |
| 4,203,800 | 5/1980 | Kitcher et al. | 156/643 |
| 4,478,678 | 10/1984 | Watanabe | 156/643 |
| 4,543,597 | 9/1985 | Shibata | 156/643 X |
| 4,615,764 | 10/1986 | Bobbio et al. | 156/643 |

*Primary Examiner*—Thi Dang
*Attorney, Agent, or Firm*—Philip A. Dalton

[57] ABSTRACT

Gas chemistry and a related RIE mode process is described for etching silicides of the refractory metals titanium, tantalum, tungsten and aluminum and for etching composites of these silicides on polycrystalline silicon layers. $BCl_3$ is added to the $HCl/Cl_2$ gas chemistry used for the polysilicon etch along with additives selected from fluorinated gases and oxygen to satisfy the multiple requirement of the two-step silicide-polysilicon etch process, including the silicide-to-polysilicon etch ratio requirement.

9 Claims, 11 Drawing Sheets

MATERIALS AND METHODS FOR ETCHING SILICIDES, POLYCRYSTALLINE SILICON AND POLYCIDES

This is a divisional application of Ser. No. 443,811, filed Nov. 29, 1989, now U.S. Pat. No. 5,112,435, which is a continuation of Ser. No. 185,256, filed Apr. 19, 1988, now abandoned, which is a continuation of Ser. No. 786,783, filed Oct. 11, 1985, now abandoned.

BACKGROUND OF THE INVENTION

The present invention relates in general to a process for etching conductive layers used in semiconductor integrated circuits (IC). In particular, the invention relates to methods for etching metal silicides, polycrystalline silicon (polysilicon) and composite silicide-polysilicon (polycide) structures and to reactive plasma gas chemistry for use in such methods.

Over the past several years, the silicon integrated circuit technologies used in manufacturing conductor-insulator-semiconductor field effect transistor (CISFET) devices and bipolar transistor devices have developed to the point that they provide very small geometry, highly dense integrated circuits. The continued improvement in silicon integrated circuit integration has been made possible by advances in the manufacturing equipment, as well as in the materials and methods used in processing semiconductor wafers and IC chips. At the same time, however, the increasingly stringent requirements imposed by the improvements in the silicon integrated circuit integration and density have strained much of the classic microelectronics processing technology. For example, with the trend toward greater device densities and smaller minimum feature sizes and smaller separations in integrated circuits, the sheet resistance of multi-level interconnects and gate electrodes and other conductors becomes a primary factor affecting frequency characteristics and power consumption, and in limiting device speed. Thus, to successfully implement greater density without adversely affecting such characteristics, it is necessary to reduce the sheet resistance of the gate and conductor materials.

Another requirement which must be met to achieve the increasingly small minimum feature sizes and minimum separations is that the lithographic pattern-transfer process must be very precise. In addition to factors such as the lithographic process itself and the wafer topography, satisfaction of this requirement necessitates in general the use of an anisotropic plasma or dry etching technology that is capable of precisely replicating the mask dimensions and size in the etched layer without degradation of the mask and loss of line width.

The two basic types of plasma etching systems—plasma etching itself in which the chemical etching component is dominant and reactive ion etching in which physical ion bombardment is dominant—are described in commonly assigned U.S. Pat. No. 4,376,672, entitled, 'Material and Methods for Plasma Etching of Oxides and Nitrides of Silicon', filed Oct. 26, 1981 and issued Mar. 15, 1983. That description is hereby incorporated by reference. Of the different types of plasma etching systems, it is believed that reactive ion etching systems are the preferred systems for achieving high resolution replication of photoresist patterns, for example, in electrically conductive materials.

Figure 1:
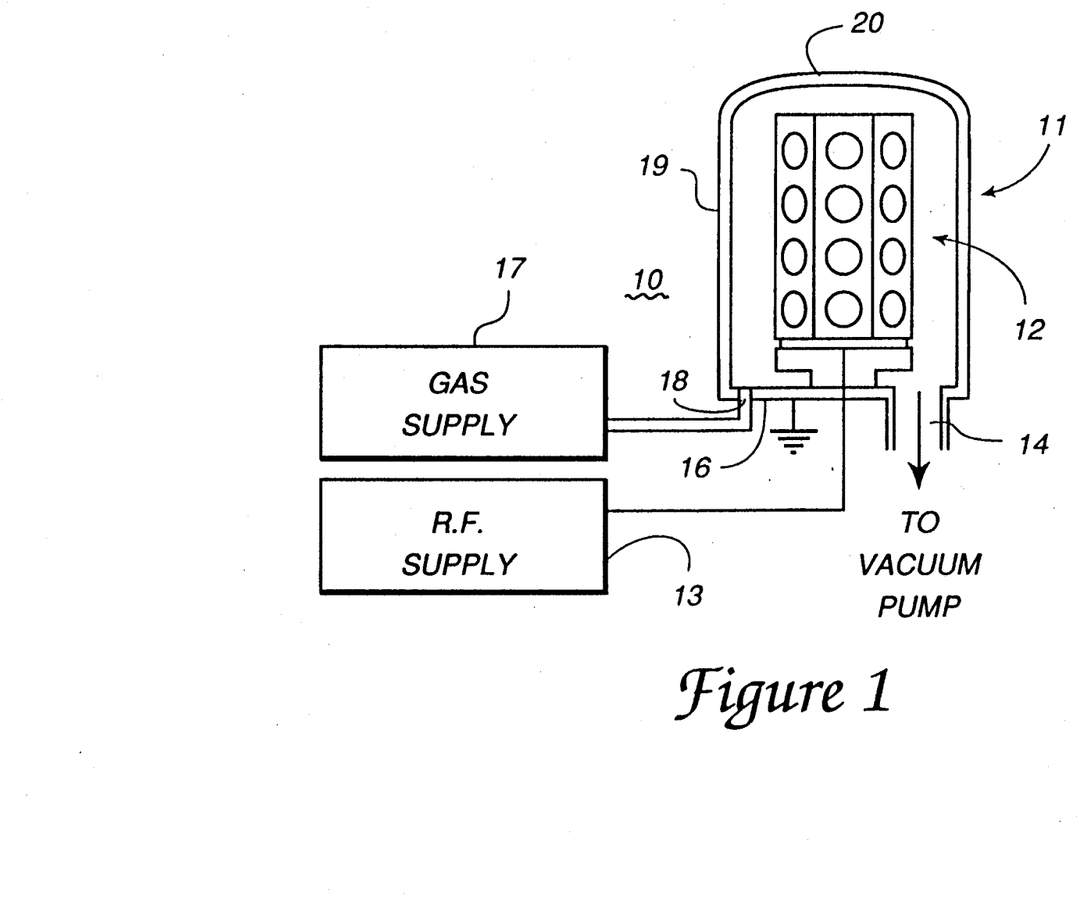
FIG. 1 is a schematic illustration of a plasma etcher which can be used to etch silicide and polysilicon in accordance with the present invention.

FIG. 1 schematically illustrates an etching system 10 that is one presently preferred system for reactive ion etching. This system 10 is available commercially from Applied Materials, Inc. of Santa Clara, Calif. as the 8100 Series System. This system 10 utilizes a cylindrical reaction chamber 11 and a hexagonal cathode 12 which is connected to an RF power supply 13. An exhaust port 14 communicates between the interior of the reaction chamber and a vacuum pump. The walls of the reaction chamber 11 and the base plate 16 form the grounded anode of this system. A supply of reactive gas from gas supply 17 is communicated to the interior of the chamber 10 through an entrance port 18 and by a conduit arrangement 19 to a gas distribution ring 20 at the top of the chamber. The reactor 10 is asymmetric. That is, the anode-to-cathode ratio is slightly greater than two-to-one, resulting in high energy bombardment of the hexagonal cathode surface 12 relative to the anode surface 11. Such a design provides lower power density and better etch uniformity, decreases contamination of and from the chamber walls and promotes a higher anisotropy. Additionally, the cathode structure configuration allows all wafers to be vertically oriented during the process to minimize wafer exposure to particulates.

Despite the availability of plasma etching systems such as the AME 8100 System 10, the microelectronics polycrystalline silicon processing technology, like the rest of the classic microelectronics technology, has been strained by the increasing levels of silicon integrated circuit integration. Polysilicon has been and is widely used in both bipolar and CISFET IC technology, for example in conductors, such as gate electrodes; in single level and multi-layer interconnects; in resistors; in buried contacts; and in the formation of emitter structures such as shallow self-aligned emitters and self-aligned emitter-contact structures. However, meeting the sheet resistance requirements in very small devices and conductors requires very high polysilicon doping levels which are obtained at the cost of isotropic etch behavior and precise pattern transfer.

Over the last several years, the microelectronics industry has been developing polycide technology as a substitute for polysilicon technology in a number of applications, in part because polycides have much lower sheet sensitivities than doped polysilicon. Polycide is a layer of metal silicide over a layer of polysilicon. Of primary interest here are the refractory metal silicides (typically disilicides): titanium silicide, $TiSi_x$; tantalum silicide, $TaSi_x$; molybdenum silicide, $MoSi_x$; and tungsten silicide, $WSi_x$.

POLYCIDE ETCH REQUIREMENTS

In general, there are certain requirements which must be satisfied when etching any material, including conductive layers, during intergrated circuit fabrication. The conductive layer should be etched to an anisotropic profile (vertical or slopping) with the minimum line width loss in the masking layer and etched material. There should be good etch selectivity to overlying layers (principally the mask) and to underlying layers. Preferably there is a moderate to high etching rate associated with the etching step (multiple steps in the case of polycide). The etch step(s) should be residue free. In addition, the etch process must provide uniform characteristics which are reproducible from run-to-run. Also, device damage must be avoided.

The art has used fluorinated CF$_4$/O$_2$ gas mixtures in a high pressure plasma etching mode to provide anisotropic etch profiles of titanium silicide. In addition, at lower pressures, typically 3–200 millitorr, using the reactive ion etching (RIE) mode, tungsten, molybdenum and tantalum silicides have been etched anisotropically (as has titanium silicide) using fluorinated gas chemistry. However, while fluorinated chemistry applied in a low pressure, RIE mode can provide anistropic clean etching of silicides, there is a tendency to undercut polysilicon and to low selectivity to oxide.

BCl$_3$/CL$_2$ gas chemistry has been used to etch tantalum polycide anisotropically. In general, chlorinated gas chemistry has a lesser tendency to undercut polysilicon and provides higher selectivity to oxide, but has a tendency to leave residues.

In short, it is very difficult to obtain both anisotropy and high selectivity to oxide during the silicide etch. At least in part because of this difficulty, the art has utilized multi-step processes for polycide etching. Using this approach, high selectivity to oxide is a requirement during etching of the underlying polysilicon, but not during the silicide etch step. In fact, it is desirable that the silicide etch be able to etch oxide, to remove any residual native oxide on the silicide surface and at the silicide-polysilicon interface. That is, it is actually preferable to have a low etch selectivity to oxide, rather than a high selectivity to oxide, during the silicide etch step.

While the use of a multi-step process for etching silicide and polysilicon somewhat eases the difficulties associated with single step etching, it substitutes a different set of requirements for each step. First, high selectivity to the polysilicon is critical during the silicide etch step. Also, high selectivity to the underlying layer such as oxide is critical only during the polysilicide etch step. In addition, compatibility between the silicide and polysilicon etch steps is required in that the silicide etch must not undercut the poly or affect the poly etch step performance, and the poly etch in turn must not undercut the silicide.

TOPOGRAPHY ETCH REQUIREMENTS

In addition to the above requirements, which are known in the art, we have discovered a less obvious silicide-to-polysilicon etch selectivity requirement. This requirement pertains to the step of etching the silicide component of polycide structures that are formed on non-planar, stepped topography. Stepped topography is associated, for example, with recessed or semi-recessed dielectric isolation and with multi-layer metal interconnect structures. Specifically, we have determined that the filaments or fences frequently formed adjacent the steps in polycide etching are eliminated by a sufficiently high silicide:polysilicon etch rate ratio, R. We have quantified that etch rate ratio as a function of polycide film thickness, topographic step height and angle.

Figure 2:
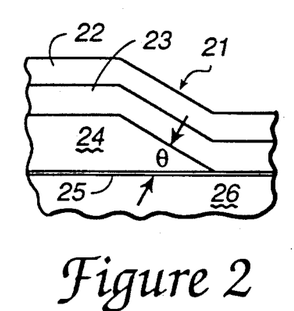
FIGS. 2–5; 2A–5A; and 2B–5B schematically depict the process of etching polycide structures formed on topographical steps of $\theta = 30°$, $60°$ and $75°$, respectively.
Figure 2A:
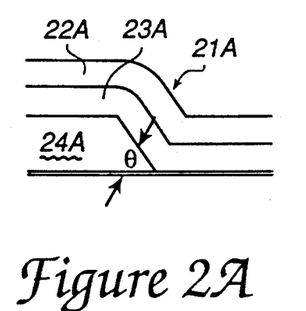
Figure 2B:
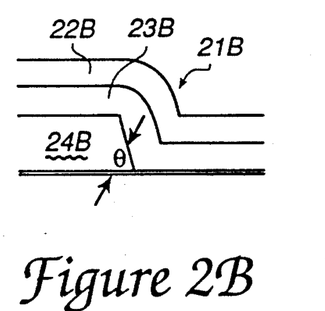

FIGS. 2–5, 2A–5A and 2B–5B schematically depict the process of sequentially etching polycide structures formed over topographical steps of different angles, $\theta = 30°$, 60° and 75°. A multiple step reactive ion etch process is assumed, involving separate silicide and polysilicon etch steps and a silicide etch step which provides a silicide:polysilicon etch rate ratio of about 2:1. The structure 21 of FIG. 2 is a starting silicide 22-on-polysilicon 23 sandwich formed over a topographical step 24 of silicon oxide that forms a relatively shallow step angle ($\theta = 30°$) with the oxide underlayer 25 and substrate 26. FIGS. 2A and 2B are similar to FIG. 2 except that the topographical angles are $\theta = 60°$ and 75°, respectively. The step etch sequence begins in FIGS. 3, 3A and 3B using reactive ion etching to remove the silicide layer 22.

Figure 3:
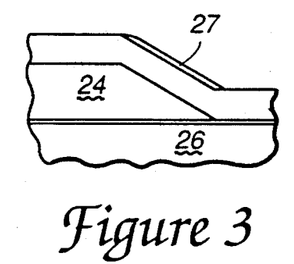
Figure 3A:
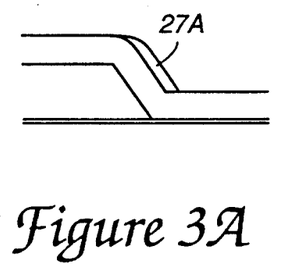
Figure 3B:
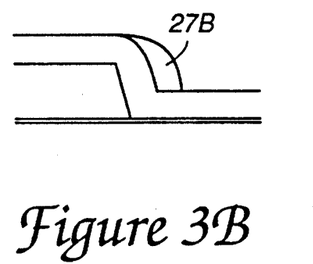
Figure 4:
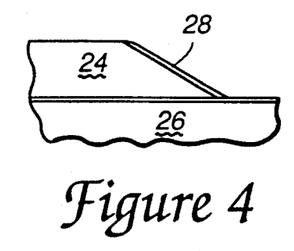
Figure 4A:
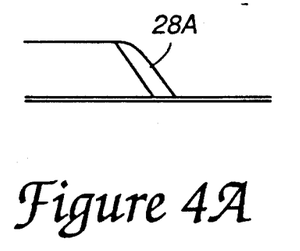
Figure 4B:
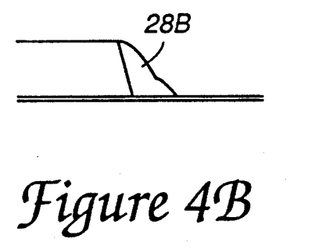
Figure 5:
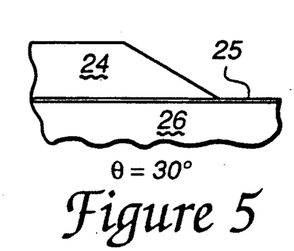
Figure 5A:
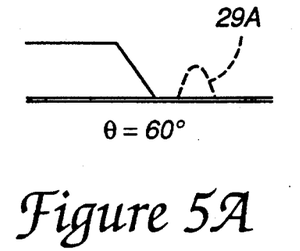
Figure 5B:
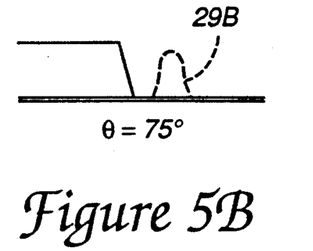

As shown in FIG. 3, when the polysilicon is just exposed by the silicide etch, a thin silicide residue 27 remains on the sidewall or riser of the 30° step. Then the residue is removed by a subsequent silicide overetch, and an RIE mode polysilicon etch is used to remove the polysilicon 23. FIG. 4 illustrates when the gate oxide is just exposed by the polysilicon etch. At this point, because of the silicide residual layer 27 and the step angle, a residual layer of polysilicon 28 remains on the sidewall. This residual 28 is removed by a polysilicon overetch of about 20 percent, FIG. 5. Because the polysilicon etch exposes the gate oxide 25, a high selectivity to oxide is required to prevent degradation/destruction of the oxide during the poly overetch.

Similar etch sequences are employed for the 60° and 75° step structures, but result in thicker silicide sidewall residual layers 27A and 27B and thicker polycide residual layers 28A and 28B. Assuming a sufficiently high selectivity to oxide during the polysilicon etch, these residuals can be removed by the polysilicon overetch without destroying the gate oxide.

The result is quite different if, during the silicide etch, the silicide-to-polysilicon etch rate ratio is too low to remove the silicide residual. That is, if the silicide etching step cannot meet the etch rate requirement for a given topography and therefore does not remove the silicide residual on the sidewall/riser before etching through the poly and exposing the gate oxide, the polysilicon etch step must replace the silicide etch step to save the gate oxide. Typically, the polysilicon etch step does not effectively etch silicide. The silicide residue along the topographic step thus acts as a micromask to form a free-standing silicide-polysilicon filament or fence along the step. See filaments 29A and 29B shown in phantom in FIGS. 5A and 5B. The filament has a height similar to the polysilicon layer thickness and departs from the topographic step about the same distance It has been known in the art that a high silicide:polycide etch rate ratio is required to provide residue-free removal of silicide over topographical steps and to avoid filaments along the steps. However, the prior art has not quantified the relationship of the silicide etch selectivity to polysilicon and, in fact, is believed not to have recognized the existence of a specific relationship between this selectivity and the step geometry and thickness. Furthermore, the prior art has not provided an etch chemistry capable of eliminating the silicide filaments and satisfying the other silicide etch requirements.

SUMMARY OF THE INVENTION

In view of the above discussion, it is a primary object of the present invention to etch the refractory metal silicide-polysilicon sandwich structure while keeping linewidth loss to a minimum and with the required selectivity to oxide to maintain gate oxide integrity.

It is also an object of the present invention to provide an etching gas composition and an associated plasma process for etching silicides of tungsten, molybdenum, titanium and tantalum with the high selectivity for polysilicon which is required to etch topographical structures without leaving silicide residue.

It is a related object of the present invention to provide a gas etching composition and an associated plasma etching process for anisotropically etching silicides with a high selectivity for overlying photoresist mask layers and for underlying polysilicon layers, with a relatively low-to-moderate selectivity for oxide.

It is another related object of the present invention to provide a silicide etching gas composition and an associated plasma etch process for silicide, of the type described above, in combination with a process for etching polysilicon anisotropically, without undercutting of the silicide and with a high selectivity to oxide; and in an overall process that provides high throughput and utilizes the same base gas chemistry for the silicide and polysilicon etch steps.

In one aspect, the present invention relates in part to the use of $HCl/Cl_2$ gas chemistry as the basic gas chemistry for etching refractory metal silicides and polysilicon. The use of $HCl/Cl_2$ gas chemistry in the polysilicon etch step and $BCl_3$-containing $HCl/Cl_2$ gas chemistry in the silicide etch step permits an essentially continuous silicide and polysilicon etch process in the same chamber without breaking vacuum. $HCl/Cl_2$ gas chemistry provides high rate anisotropic etching of the underlying polysilicon with selectivity to underlying oxides such as gate oxide layers. $BCl_3$-containing $HCl/Cl_2$ gas chemistry selectively doped with relatively small volumetric amounts of dopant gas not only etches all four refractory metal silicides anisotropically, but also provides the required high etch rate ratio of silicide to polysilicon to provide a clean, filament free etch. In addition, the $BCl_3/HCl/Cl_2$ gas chemistry provides a high selectivity to organic photoresist masks and the desired etchability of oxide. In more general terms, the process is consistent with requirements of anisotropic polycide profiles, minimum linewidth loss, cleanliness, uniformity and reproducibility.

DETAILED DESCRIPTION OF THE INVENTION

1. Determination of R (Silicide:Polysilicon Etch Ratio)

a. Formulation

Figure 6:
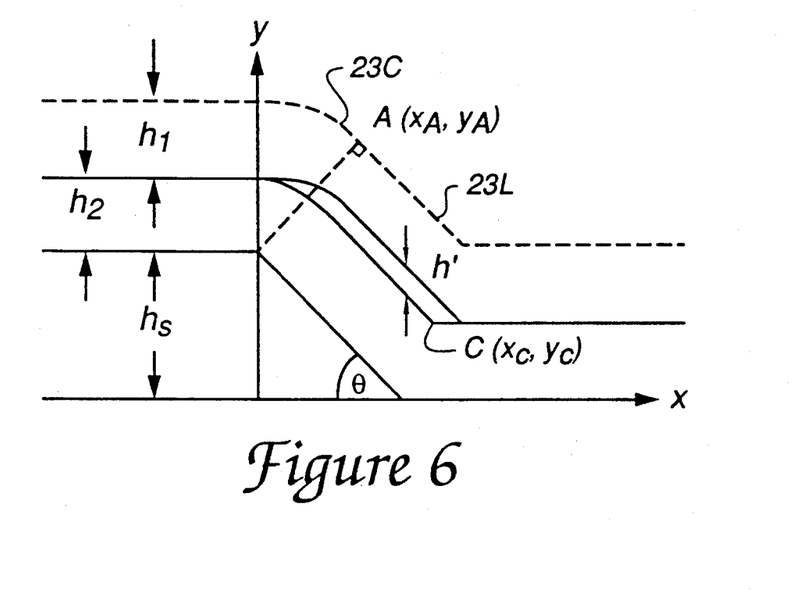
FIGS. 6 and 7 illustrate the dimensions and geometrical relationships associated with step topography of small angles and large angles, respectively.
Figure 7:
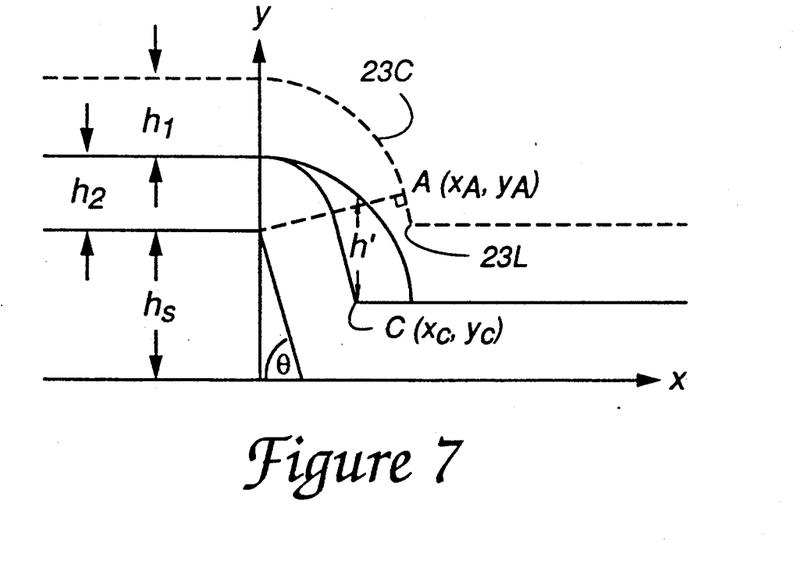

Referring to FIGS. 6 and 7, to quantitatively describe the required etch rate ratio, R, of silicide to polysilicon, it is assumed the silicide and polysilicon films 22 and 23 (FIG. 2) have conformal coverage; $h_1$ and $h_2$ are the thickness of the silicide and polysilicon, respectively; $h_s$ is the topographic height of oxide step 24; and $\theta$ is the topographic angle ($0 \leq \theta \leq 90°$).

When the polysilicon 23 is just exposed during the silicide etching step, the thickest remaining silicide is always located at the foot point C as shown in FIGS. 6 and 7. There are two portions on the topographic step: one 23C is curved, the other 23L is linear; they are separated at boundary point A.

If the boundary point A is behind the foot point C as shown in FIG. 6, that is, when the topographic angle $\theta$ is low, then the thickest remaining silicide will be located in the linear portion and is given by:

$$h' = \frac{h_1}{\cos\theta} - h_1 = h_1\left(\frac{1 - \cos\theta}{\cos\theta}\right). \quad (1)$$

The required etch rate ratio of silicide to polysilicon is then equal to the remaining silicide to polysilicon thickness ratio:

$$R = \frac{h'}{h_2} = \frac{h_1}{h_2}\left(\frac{1 - \cos\theta}{\cos\theta}\right). \quad (2)$$

If the boundary point A exceeds the foot point C, as shown in FIG. 7, that is, when the topographic angle $\theta$ is high, the thickest remaining silicide is in the curved portion and the thickness will be:

$$h' = \left[(h_1 + h_2)^2 - \left(\frac{h_s}{\tan\theta} + h_2 \tan\frac{\theta}{2}\right)^2\right]^{\frac{1}{2}} + h_s - h_2 - h_1. \quad (3)$$

The required etch ratio then will be:

$$R = \frac{h'}{h_2} = \frac{1}{h_2}\left\{h_s - \left(h_1 + h_2\right) + \right. \quad (4)$$

-continued $$\left[ (h_1 + h_2)^2 - \left( \frac{h_s}{\tan\theta} + h_2 \tan\frac{\theta}{2} \right)^2 \right]^{\frac{1}{2}} \right\}.$$

When the topographical step is vertical, i.e. $\theta = 90°$:

$$R = \frac{1}{h_2} \{ h_2 - (h_1 + h_2) + [(h_1 + h_2)^2 - h_2^2]^{\frac{1}{2}} \}. \quad (5)$$

b. Discussion of Process Requirements

Figure 8:
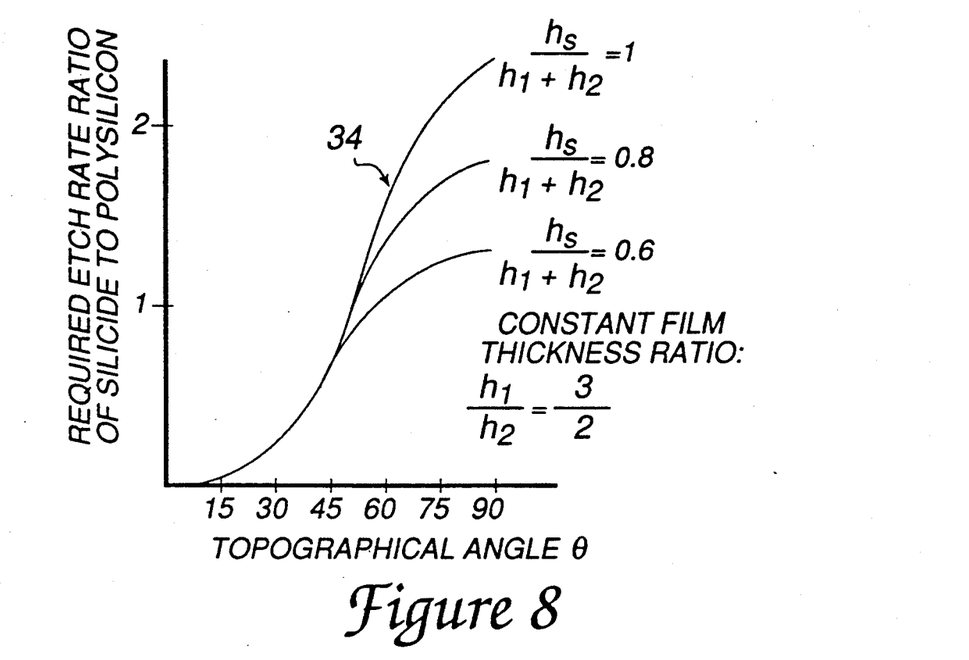
FIGS. 8 and 9 graphically illustrate the required etch rate ratio of silicide to polysilicon for different topographical angles $\theta$.
Figure 9:
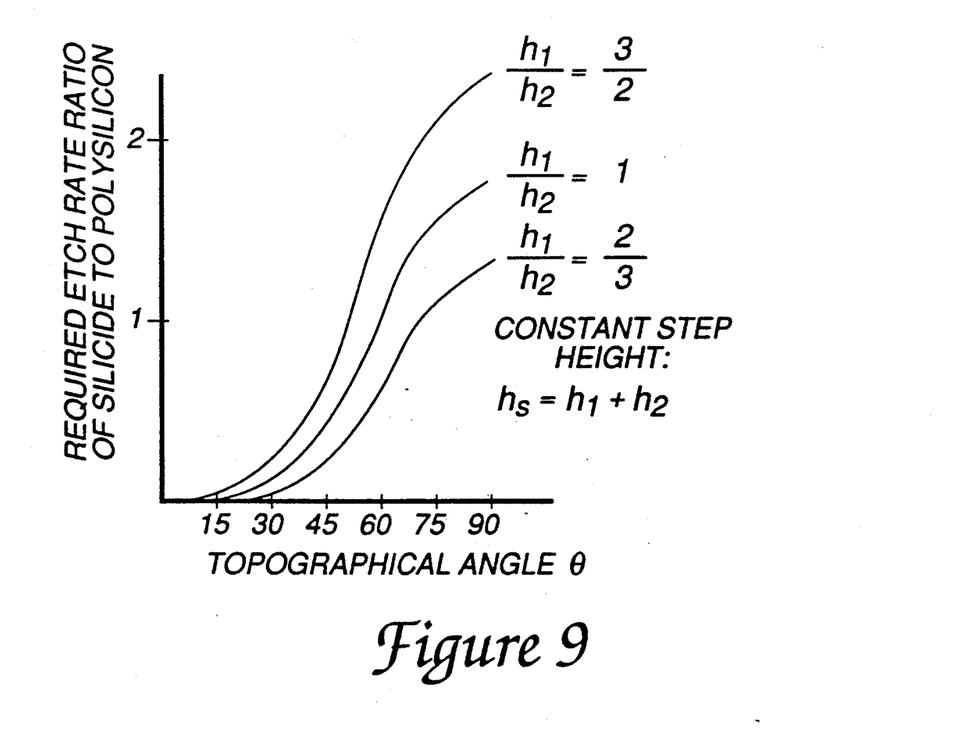

Using equation (2) and (4), the required etch rate ratios are plotted as a function of $\theta$ in FIG. 8 and FIG. 9, using $h_1/h_2$ (curve 34, FIG. 8) and $h_s/h_1+h_2$ (curve 35, FIG. 9) as discrete parameters.

The required etch rate ratio monatonically increases when topographical angle $\theta$ increases. The steepest rate of increase is around 45°-60°. For small $\theta$, the required etch rate ratio is independent of topographical step height and is related to the layer thickness ratio of silicide to polysilicon. At high $\theta$, both the step height and thickness ratio play roles in the required etch rate ratio. Using equation (2) and (4), one can calculate the required etch rate ratio for a given device topographical structure. As a typical example, for 3,000 Angstroms silicide and 2,000 Angstroms doped polysilicon over a 5,000 Angstroms, ~90° steep step the required etch rate ratio is about 2.3 to etch clean. In general, R of (1-2):1 and, preferably, ~2:1 is required for present topographies. Using $BCl_3$-containing $HCl/Cl_2$ gas chemistry R values of (1-2):1 are readily obtained for tantalum silicide and titanium silicide, but not for molybdenum and tungsten silicides.

2. Gas Chemistry for Required Silicide:Polysilicon R a. $BCl_3$-Containing $Cl_2$ Gas Chemistry

We have found that including $BCl_3$ in the chlorinated etching gas solution promotes cleanliness of the substrate during the etch process and maintains the desired profile of the etched material (that is, prevents undercutting). Specifically, we have found that this dual purpose is satisfied by using $BCl_3$ and $Cl_2$ flow rate ratios in which $BCl_3Cl_2 \geq 1:1$.

Figure 10:
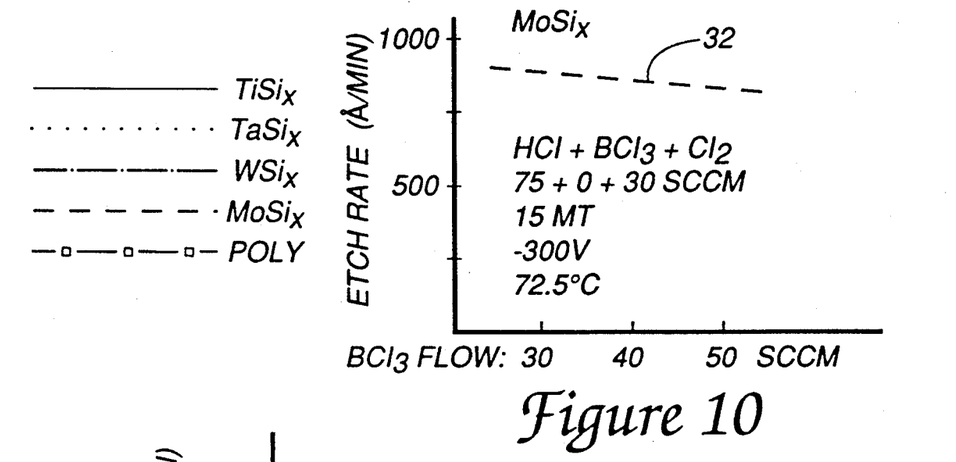
FIG. 10 depicts etch rate as a function of $BCl_3$ flow for molydenum silicide.

The $BCl_3$ does not substantially enhance the etch rate of the silicides. This is illustrated by curve 32 of FIG. 10, which depicts the molybdenum silicide etch rates which are achieved for $Cl_2/HCl$ gas chemistry by adding increasing amounts of $BCl_3$ to the $Cl_2$ and HCl flow of 30 sccm and 75 sccm at $-15$ millitorr pressure and $-300$ volts DC bias. The curve indicates the $BCl_3$ flow rate has little effect on the molybdenum silicide etch rate. If anything, the molybdenum silicide etch rate is decreased slightly by increasing the flow of $BCl_3$.

Data listed here for silicide and polysilicon polycide films were for films which were formed on oxide layers formed on single crystal silicon substrates. The polysilicon films were highly doped n-type with phosphorus to a concentration which would provide sheet resistivity of about 15-20 ohms per square for 5000 Angstrom thick films. The silicide and polysilicon films were etched by using photoresist masks about one micron thick and etching using the above-described Applied Materials, Inc. 8100 Series reactor 10. The process was also demonstrated on silicon-on-sapphire structures.

Figure 11:
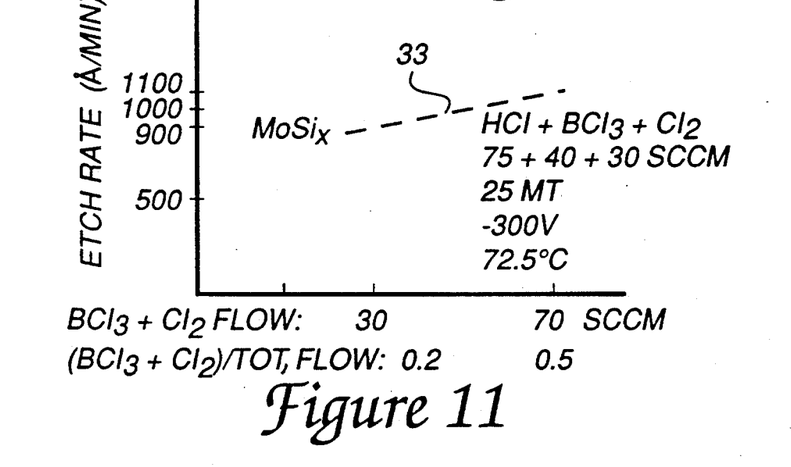
FIG. 11 depicts etch rate as a function of $(BCl_3 + Cl_2)$ flow for molybdenum silicide.

In contrast to the effect of $BCl_3$ alone, the silicide etch rate is influenced by the total $BCl_3+Cl_2$ flow rate. This is illustrated in FIG. 11. Curve 33 depicts the increase in molybdenum silicide etch rate which is achieved for $BCl_3/Cl_2/HCl$ chemistry by adding increasing amounts of $BCl_3+Cl_2$ to the HCl flow of 75 sccm at $-25$ millitorr pressure and $-300$ volts DC bias. Using the stated conditions, increasing the volume percentage of $BCl_3+Cl_2$ from 20 percent to 50 percent of the total gas flow increased the silicide etch rate from about 900 to 1100 Angstroms per minute.

Figure 12:
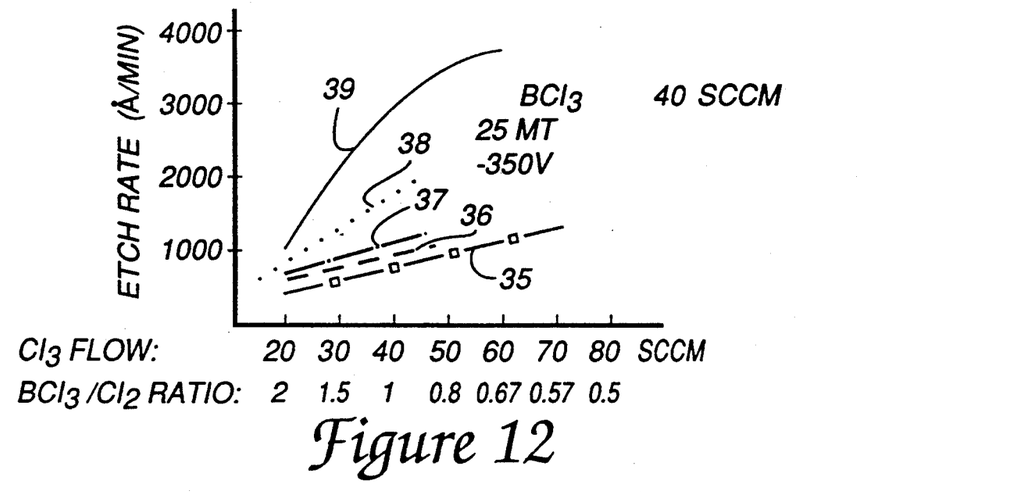
FIG. 12 depicts etch rate as a function of chlorine flow for silicides and polysilicon.

FIG. 12 illustrates the effect of chlorine on silicide etch rates. In addition, the figure illustrates the above-mentioned dichotomy in the etch behavior of titanium and tantalum silicides on the one hand, and tungsten and molybdenum silicides on the other. That is, this figure depicts the increases in the silicide etch rate and in the silicide:polysilicon etch rate ratio which are achieved for $BCl_3/Cl_2$ gas chemistry by L adding increasing amounts of chlorine to the $BCl_3$ flow of 40 sccm. Curve 35 shows the variation in polysilicon etch rate as a function of chlorine flow rate using 25 millitorr pressure and $-350$ volts DC bias. Curves 36 and 37 illustrate the etch rates of molybdenum silicide and tungsten silicide under the same conditions. The molybdenum etch rate curve 36 and the tungsten curve 37 nearly parallel the polysilicon curve 35 and have etch rate ratios, R, relative to the polysilicon of slightly greater than 1:1. In contrast, under the same conditions, the tantalum curve 38, has $R \geq 2:1$ for chlorine flows greater than about 20 sccm (that is, over the entire range of flow rates of FIG. 12). Similarly, for the titanium curve 39, $R \geq 2$ over the entire range of flow rates of FIG. 12 and $R \approx (3-4):1$ over much of the flow rate range.

Figure 13:
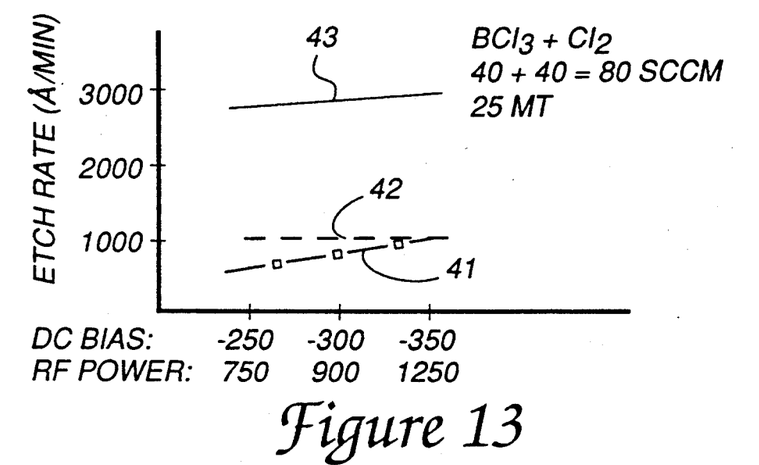
FIG. 13 depicts etch rate as a function of DC bias (RF power) for titanium and molybdenum silicides and polysilicon.
Figure 14:
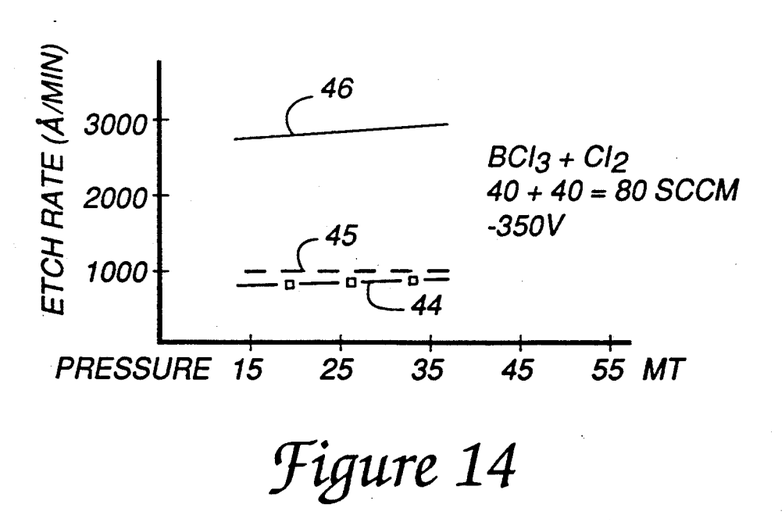
FIG. 14 depicts etch rate as a function of chamber pressure for titanium and molybdenum silicides and polysilicon.

Furthermore, FIGS. 13 and 14 illustrate that these etch rate ratios are relatively insensitive to RF power (DC bias voltage) and to chamber pressure, at least over a substantial range of conditions. The data of FIG. 13 were taken using $BCl_3$ and $Cl_2$ flow rates of 40 sccm each and a chamber pressure of 25 millitorr. The change in the etch rates of the titanium curve 43 and the molybdenum curve 42 as a function of DC bias voltage do not differ significantly from the slope of the polysilicon etch rate curve 41. Also, the titanium, molybdenum and polysilicon curves 46, 45 and 44 of FIG. 14, associated with $BCl_3$ and $Cl_2$ flow rates of 40 sccm and $-350$ volts DC bias, have similar relative slopes. Consequently, DC bias and pressure per se cannot be relied upon under these conditions to increase the etch rate ratio of molybdenum and, presumably, of tungsten silicides. (It should be noted that despite the relative insensitivity of the titanium etch rate ratio and the tantalum etch rate ratio to power (DC bias voltage) and pressure, those etch rate ratios were at an excellent, high level throughout FIGS. 13 an 14.)

In short, the $BCl_3/Cl_2$ chemistry provides excellent silicide:polysilicon etch rate ratios for titanium and tantalum silicides which are believed sufficient for essentially all present topographical geometries. However, the tungsten and molybdenum silicide:polysilicon etch rate ratio of about 1:1 is still too low for many topographical IC devices. It should also be noted that, even where very high etch rate ratios (of about 2:1) are not required because of the particular topography (for example, when low $\theta$ is acceptable), a high etch rate ratio of silicide to polysilicon is still preferable to clean up the silicide residue with a minimum overetch.

b. Dopant:Additive Effects

Figure 15:
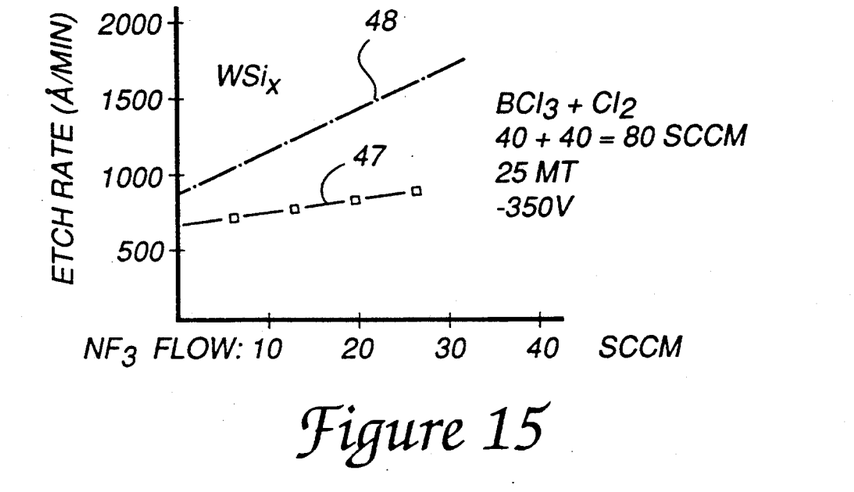
FIG. 15 depicts etch rate as a function of $NF_3$ flow for tungsten silicide and polysilicon.

The molybdenum and tungsten silicides-to-polysilicon etch rate ratios are increased by adding small volumetric amounts of oxygen and fluorinated dopant/additive gases to the $BCl_3$-containing chlorine gas. FIG. 15 depicts the increases in etch rates and in the relative etch rate ratio of tungsten silicide to polysilicon by adding increasing amounts of $NF_3$ to $BCl_3/Cl_2$ gas chemistry. Curve 47 shows the variation in polysilicon etch rate as a function of $NF_3$ flow rate at 25 millitorr chamber pressure, $-350$ volts DC bias and $BCl_3$ and $Cl_2$ flow rates of 40 sccm each. Similarly, curve 48 shows the variation in the tungsten etch rate as a function of the $NF_3$ flow rate under the same conditions. The silicide:polysilicon etch rate ratio is greater than about 2:1 for $NF_3$ flow rates greater than about 20 sccm (greater than about 20 volume percent of the total $BCl_3+Cl_2+NF_3$ additive gas flow rate of 100 sccm).

Figure 16:
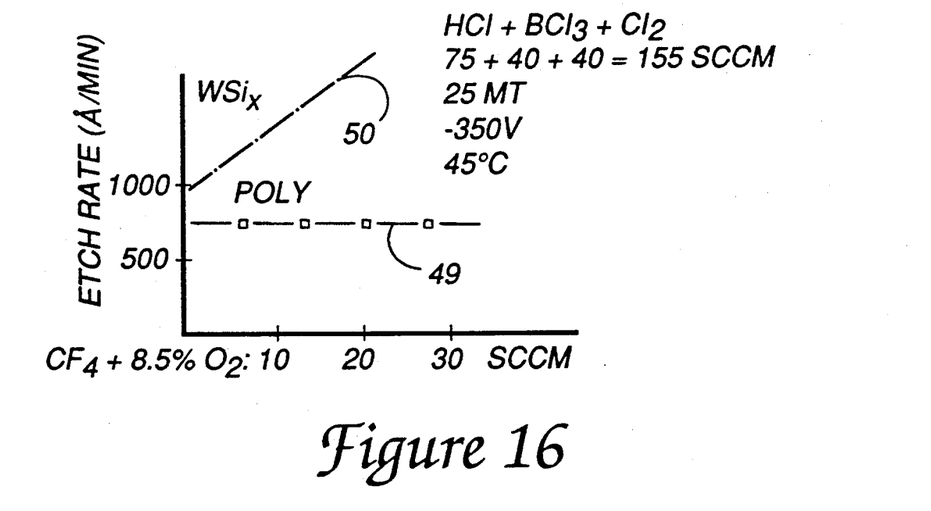
FIGS. 16–19 depict tungsten/molybdenum silicide etch rates and polysilicon etch rates as a function of additive gas flow at various hexode temperatures.

Similar results were obtained for other flow rate combinations and other fluorinated additives. FIG. 16 depicts the increase in etch rates and etch rate ratio of tungsten silicide and polysilicon for $BCl_3/Cl_2/HCl$ gas chemistry by adding increasing amounts of the gas mixture $CF_4+8.5\%$ $O_2$. The etch conditions were 25 millitorr, $-350$ volts DC bias, $45°$ C. hexode temperature and $HCl/BCl_3/Cl_2$ flow rates of 75/40/40 sccm. As the $(CF_4+8.5\% \ O_2)$ flow rate was increased, an etch rate ratio of about 2:1 was reached at dopant gas flow rates of about 25–30 sccm (about 14–16 percent by volume of the total $BCl_3+Cl_2+HCl+$additive gas flow rate of 180–185 sccm).

Fluorinated additives have also been used to increase the etch rate of molybdenum silicide, but oxygen additives have proven more effective than fluorinated for this purpose. As shown in FIGS. 17–20, the oxygen additive effect on molybdenum silicides has proven to be sensitive to the hexode temperature, and is sufficient to effectively double the molybdenum silicide etch rate without substantially affecting the polysilicon etch rate.

Figure 17:
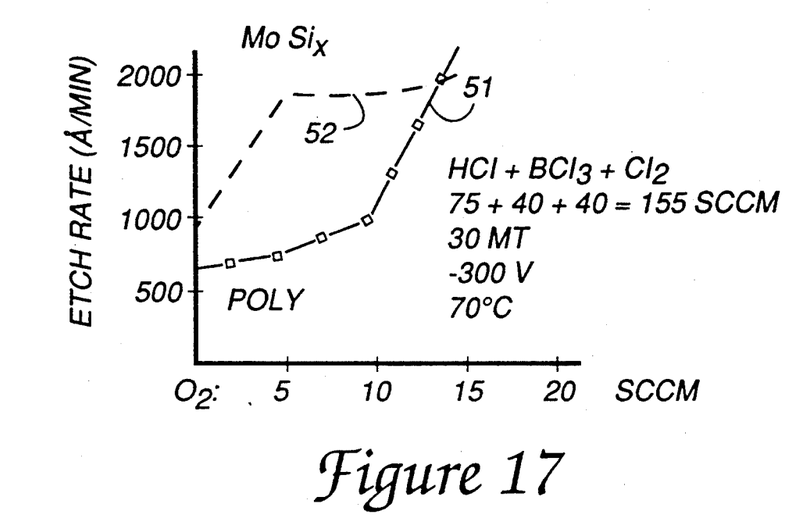

The etching data of FIGS. 17–20 were taken using (25–30) millitorr chamber pressure, ($-300$ to $-350$) DC bias, and $HCl/BCl_3/Cl_2$ flow rates of 75/(30–40)/(25–40) sccm. Referring to FIG. 17, for $HCl_3/BCl_3/Cl_2$ flow rates of 75/40/40 sccm, 30 millitorr chamber pressure, $-300$ volts DC bias and $70°$ C. hexode temperature, the molybdenum etch data, curve 52, and the polysilicon etch data, curve 51, provide an etch rate ratio of about 2:1 at a very low oxygen flow rate range of about 4–10 sccm. This is about 2.5–6 volume percent of the total gas flow of 159–165 sccm. As mentioned, the FIG. 17 data were taken using a hexode temperature of $70°$ C., which is effectively the temperature of the wafers during the etch process. Note, above the oxygen flow rate of 10 sccm, the R rapidly decreases to less than 1:1.

Figure 18:
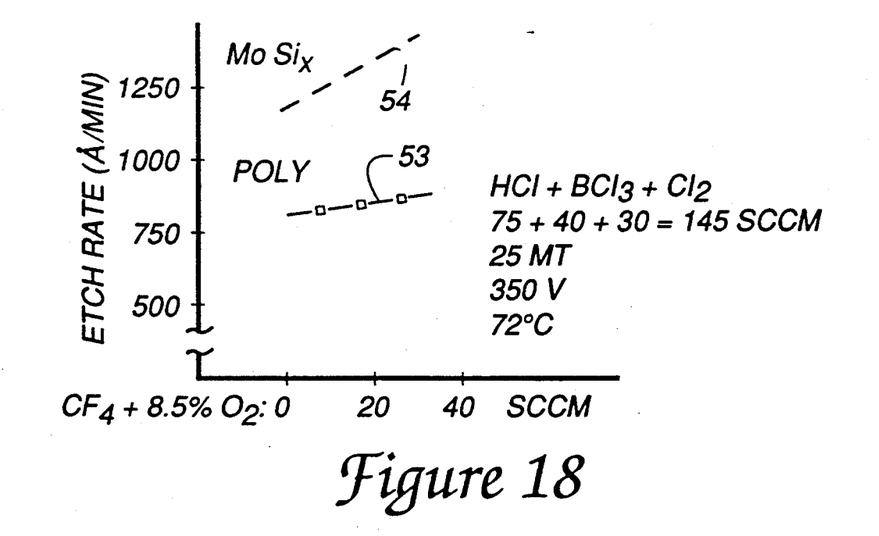

FIG. 18 exhibits a similar, but less additive-sensitive effect, on the molybdenum silicide:polysilicon etch rate ratio using a fluorinated-oxygen mixture of $(CF_4+8.5\% \ O_2)$. That is, for $HCl_3/BCl_3/Cl_2$ flow rates of 75/40/30 sccm, 25 millitorr chamber pressure, $-350$ volts DC bias, and $72°$ C. hexode temperature, the molybdenum silicide etch data, curve 54, and the polysilicon etch data, curve 53, exhibit an etch rate ratio of about 2:1 for dopant gas flow rates greater than about 25 sccm (about 15 volume percent of the total gas flow rate of 170 sccm).

Figure 19:
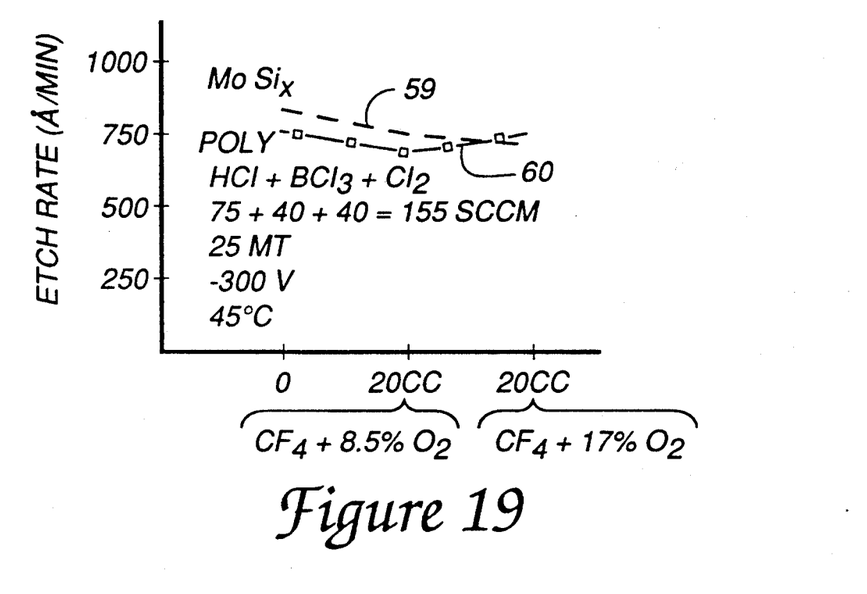
Figure 20:
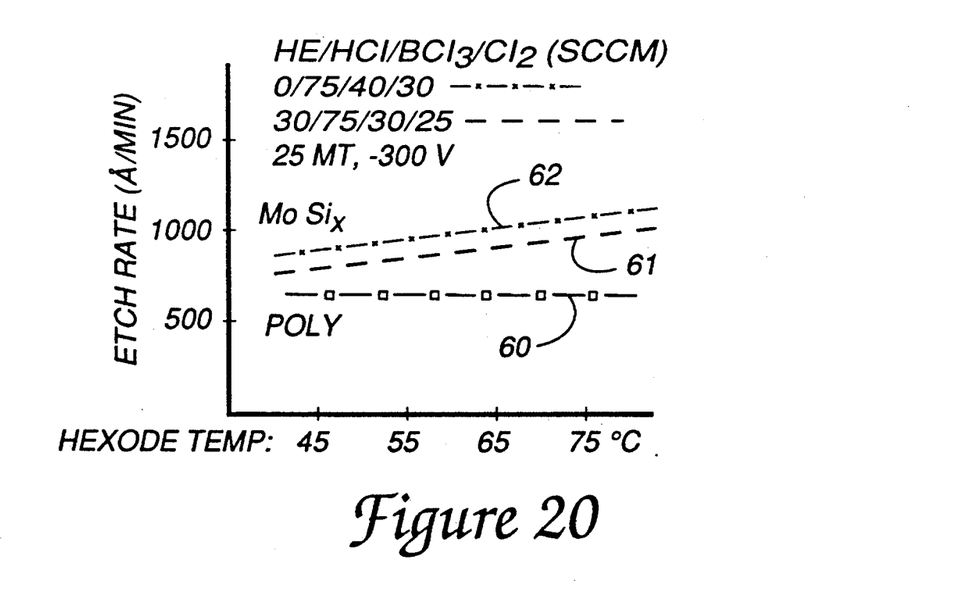
FIGS. 20 and 21 illustrate the effect of hexode temperature on polysilicon etch rate and on molybdenum silicide etch rate for etching gases which are devoid of and contain a small volume percentage of additive gas, respectively.
Figure 21:
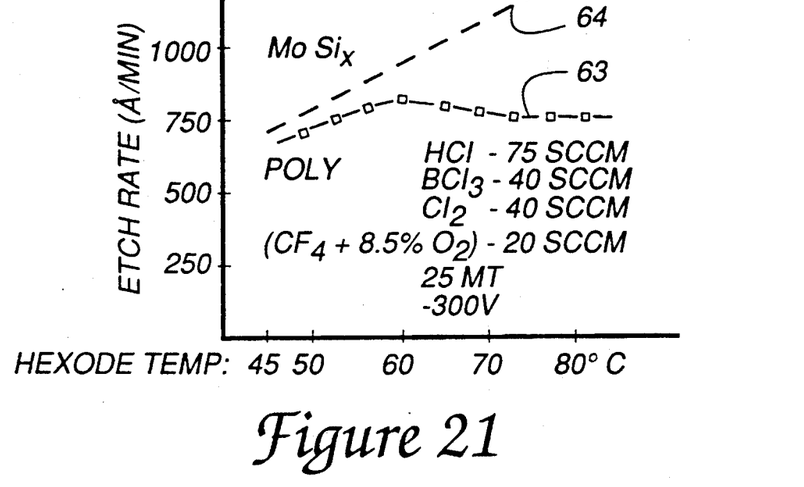

FIGS. 19 through 21 indicate that the etch rate ratio-enhancing effect shown in FIGS. 17 and 18 is the result of the additive effect of temperature as well as the dopant gas. FIG. 19 illustrates that adding increasing amounts of $(CF_4+8.5\% \ O_2)$ may in fact slightly decrease the etch rate ratio of molybdenum silicide, curve 59, to polysilicon, curve 58.

The molybdenum and polysilicon etch data shown in curves 62 and 61 of FIG. 20 illustrate that increasing the hexode temperature over the range $45°$ C. to $75°$ C. in the absence of additive dopant gas increases the silicide:polysilicon etch rate ratio.

Comparing FIG. 21 to FIG. 20 (and to FIG. 17) illustrates the double additive effect provided by the presence of a fixed volumetric percentage of the dopant gas $(CF_4+8.5\% \ O_2)$ in the $BCl_3/Cl_2$ etching gas mixture as the hexode temperature is increased. The FIG. 21 etch data were taken for $HCl/BCl_3/Cl_2/(CF_4+8.5\% \ O_2)$ flow rates of 75/40/40/20 sccm, 25 millitorr chamber pressure and $-300$ volts DC bias. The etch rate associated with the molybdenum curve 64 quickly increased relative to the polysilicon etch data associated with curve 63 from an etch rate ratio of about 1:1 at $45°$ C. to about 2:1 at $80°$ C. The oxygen component of the additive flow rate $(8.5\% \times 20 \ sccm = 4 \ sccm)$ is about 2.3 percent of the total $BCl_3+Cl_2+HCl+$additive gas flow of 175 sccm. At a hexode temperature of $70°$ C., the etch rate ratio is nearly 2:1, similar to the value associated with the FIG. 17 data for $70°$ C.

To summarize the effects of temperature and additive gas, small volumetric percentage additions of fluorinated gas can double the tungsten silicide:polysilicon etch rate ratios of the $BCl_3/Cl_2$. Fluorinated additives also enhance the etch rate ratio of molybdenum silicide to polysilicon, but to a lesser extent. Oxygen additive is more effective than fluorinated additives for molybdenum silicide and, like the addition of fluorinated gases to the tungsten silicide etching gas, effectively doubles the molybdenum silicide etch rate and etch rate ratio to polysilicon. While the range of possibilities for varying the hexode temperature are limited, the variation of the hexode temperature is believed to be effective—certainly is effective over the range of variation available in the particular hexode reactor—in increasing the etch rate of the molybdenum silicide and the etch rate ratio to polysilicon.

Furthermore, the addition of fluorinated gases and/or oxygen to the silicide etching did not degrade the subsequent polysilicon etch process provided, that the volume percentage/amount of additives did not exceed about 20 volume percent of the total gas flow. When this limit was exceeded, polysilicon or silicide undercutting resulted; silicide etch selectivity to oxide decreased; the poly etch rate increased, decreasing the silicide-to-poly etch rate ratio, R; and residues were left on the wafers after etching.

c. Cleanliness and Profile (Undercutting)

The desirability of using the flow rate ratio $BCl_3:Cl_2 \geq 1$ for cleanliness and etching profile was discussed previously.

Figure 22:
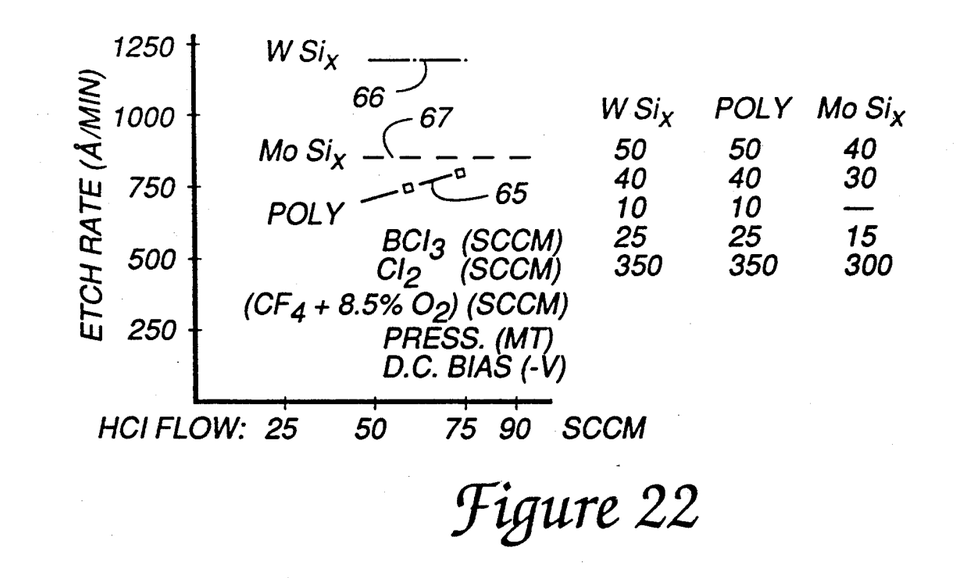
FIG. 22 illustrates the effect of HCl flow on the etch rates of polysilicon, molybdenum silicide and tungsten silicide.

FIG. 22 depicts the increases in silicide and polysilicon etch rates which are achieved for $BCl_3$-containing $Cl_2$ gas chemistry containing $(CF_4+8.5\% \ O_2)$ dopant gas by adding increasing amounts of HCl. Curve 65 shows the variation in polysilicon etch rate as a function of the HCl flow rate using 25 millitorr chamber pressure, −350 volts DC bias, 45° C. hexode temperature and $BCl_3/Cl_2/(CF_4+8.5\% O_2)$ flow rates of 50/40/10. Tungsten curve 66 illustrates that adding increasing amounts of HCl under the same conditions did not affect the molybdenum silicide etch rate provided by the basic $BCl_3/Cl_2$ gas chemistry and the dopant gas. Also, molybdenum curve 67 shows that adding increasing amounts of HCl at 15 millitorr chamber pressure, −300 volts DC bias, and $BCl_3$ and $Cl_2$ flow rates of 40 and 30 sccm, respectively, did not substantially affect the silicide etch rate. However, inspection of wafers processed under these and similar conditions revealed that the HCl was effective in providing clean etching without leaving residues on the wafer In general, the ratio $(BCl_3+Cl_2):(total\ gas\ flow) \leq 0.8:1$ is desirable to provide sufficient HCl to maintain clean etching.

d. Loading Effect

As shown, for example, in FIGS. 12 and 22, the total $BCl_3$ and $Cl_2$ flow rate (in particular, the $Cl_2$ flow rate), not the HCl flow rate is responsible for the silicide etch rate in the $HCl/BCl_3/Cl_2$ gas chemistry.

Figure 23:
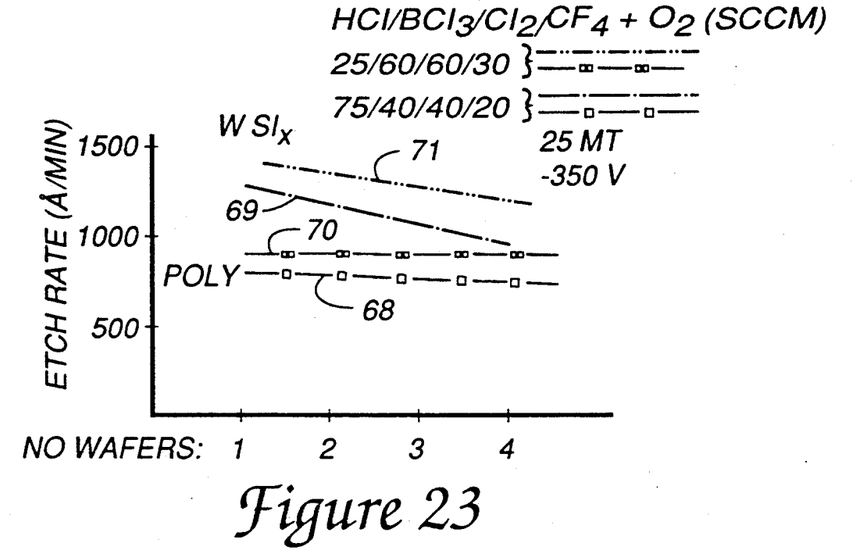
FIG. 23 depicts the loading effect on polysilicon and tungsten silicide etch rates of different $BCl_3 + Cl_2$ flow rates using the same total reactant gas flow rate.

In addition, as shown in FIG. 23, increasing the total flow rate of $BCl_3$ and $Cl_2$ diminishes the loading effect. FIG. 23 depicts the etch rate for tungsten silicide and polysilicon as a function of the number of wafers in the etch chamber. Polysilicon etch curve 68 is paired with tungsten silicide etch curve 69, whereas polysilicon etch curve 70 is paired with tungsten silicide etch curve 71. That is, curves 68 and 70 show the variation in polysilicon and tungsten silicide etch rate as a function of adding wafers to the reactor chamber under the conditions of 25 millitorr chamber pressure, −350 volts DC bias, and $HCl_3/BCl_3/Cl_2/(CF_4+8.5\% O_2)$ flow rates of 75/40/40/20 sccm for a total flow rate of 175 sccm. The tungsten silicide etch rate, curve 69, decreased rapidly as wafers were added to the etch chamber. Curves 70 and 71 depict the polysilicon and tungsten silicide etch rates under the same conditions of pressure, DC bias and total gas flow. However, the component gas flow rates for $HCl/BCl_3/Cl_2/(CF_4+8.5\% O_2)$ were 25/60/60/30. As a result, the tungsten silicide etch curve 71 was less sensitive to the addition of wafers than was tungsten silicide curve 69. This is attributed to the increase of the $BCl_3$ and $Cl_2$ flow rates from 40 to 60 sccm each.

e. Selectivity to Photoresist

Our investigation demonstrated that in addition to enhancing etch cleanliness, increasing the hydrogen containing HCl flow rate enhances (that is, increases) the overall etch selectivity over photoresist and enhances reproducibility.

Figure 24:
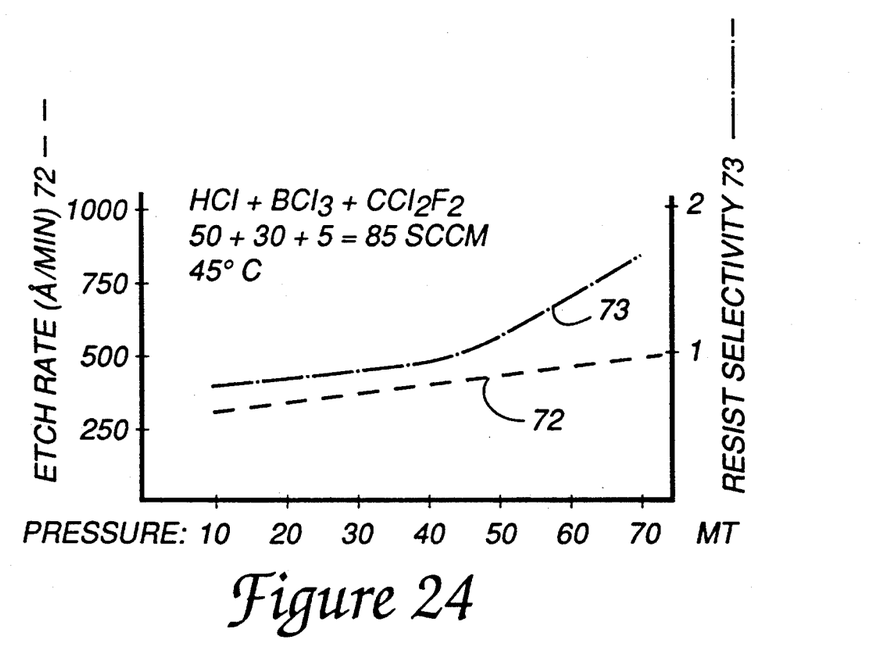
FIG. 24 depicts the effect of pressure on the etch rate of molybdenum silicide and on the overall selectivity over photoresist.

In addition, increasing pressure can be effective in increasing the overall etch selectivity for photoresist. For example, FIG. 24 illustrates the overall selectivity for photoresist during the etching of molybdenum silicide. The silicide etch used $BCl_3+CCl_2F_2+HCl$ flow rates of 30+5+50 sccm and 1100 watts power. The molybdenum silicide etching curve 72 indicates that increasing the pressure over the range 10 to 70 millitorr increased the silicide etch rate only slightly. However, curve 73 indicates that increasing the pressure over the same range increased the overall selectivity over photoresist from $\leq 1:1$ to almost 2:1.

3. Overall Silicide and Polysilicon Etch Process and Summary

Table 1 summarizes the set of working parameter ranges which have been used to etch refractory metal silicide-polysilicon composites using titanium, tantalum, tungsten and molybdenum silicides. The basic gas chemistry is the $HCl/Cl_2$ gas chemistry which is used for the polysilicon etch. In the polysilicon etch, the HCl serves to improve etching, selectivity for resist, whereas the chlorine serves as a reactant. The polysilicon and silicide etch steps use similar pressure, DC bias, HCl flow rate and $Cl_2$ flow rate ranges, so that the transition from the silicide to the polysilicon etch is primarily a matter of making any needed fine adjustments in these parameters and terminating the $BCl_3$ and the flow fluorinated gas and/or the oxygen flow. Thus, the two steps are readily implemented in the same reactor, without breaking vacuum, as essentially a continuous two-step process.

The parameters given in Table 1 are for the AME 8100 plasma etching system which has a chamber volume of ~160 liters. However, the present invention is readily transferable to other similar plasma etchers capable of operating in the reactive ion etching mode by applying the flow rate ratios given here. The conversion of flow rate ratios is contemplated in the claims defining the invention. Thus, the claims which specify gas flow rates in defining the invention are to be interpreted also in accordance with the applicable flow rate ratios, and not limited to the specific flow rates in sccm.

TABLE 1

| Process Parameters | POLYCIDE RIE ETCH | |
|---|---|---|
| | Silicide Etch | Polysilicon Etch |
| Total Gas Flow, sccm | 180 | 80–140 |
| HCl " | 40–75 | 80–100 |
| $Cl_2$ " | 60–40 | $\leq 40$ |
| $BCl_3$ " | 80–40 | — |
| $CF_4$ " | $\leq 30$ | — |
| $O_2$ " | $\leq 10$ | — |
| Pressure, mT | 15–45 | 10–40 |
| DC bias, −volts | 250–400 | 200–350 |
| Power, watts | 800–1500 | 300–800 |
| Cathode Temp., °C. | 45–75 | |

TABLE 2 gives typically presently preferred parameters for etching tungsten silicide and molybdenum silicide using $CF_4$ dopant gas for the tungsten silicide and oxygen for the molybdenum silicide.

TABLE 2

| Process Parameters | Silicide Etch | |
|---|---|---|
| | $WSi_2$ | $MoSi_2$ |
| Total Gas Flow, sccm | 175 | 165 |
| HCl " | 75 | 75 |
| $Cl_2$ " | 40 | 40 |
| $BCl_3$ " | 40 | 40 |
| $CF_4$ " | 20 | |
| $O_2$ " | | 5–10 |
| Pressure, mT | 25 | 30 |
| DC bias, −volts | 350 | 300 |
| Power, watts | 1350 | 1350 |
| Cathode Temp., °C. | 45 | 45 |

To summarize several of the critical parameters and flow rate ratios, $BCl_3:Cl_2 \geq 1:1$ is used for cleanliness and to prevent undercutting. In addition, the ratio of the $BCl_3+Cl_2$ flow rate to the total flow rate is preferably within the range of 0.8-0.4. That is, $(BCl_3+Cl_2):(total\ flow)=0.8-0.4$. As mentioned, the limit of 0.8 is used to ensure sufficient HCl for cleanliness. Below the lower limit of about 0.4, insufficient chlorine flow provides an undesirably low etch rate ratio of silicide to polysilicon. Preferably, the ratio is toward the higher end of the 0.4-0.8 range to decrease the loading effect. Finally, but not exhaustively, it is desirable that the additive gas flow rate be $\leq 20$ percent of the total gas flow. That is, $(additive\ flow):(total\ gas\ flow)\leq 0.2$. Above this limit undercutting occurs; the polysilicon etch rate increases and silicide:polysilicon etch rate ratio decreases; and the selectivity to oxide decreases. These flow rates and ratios were obtained using a total flow rate of about 180 sccm. The above flow rate ratios can be used to determine the constituent flow rates for other total flow rates.

Having thus described preferred and alternative embodiments of our silicide and polycide etch process and the associated gas chemistry, what is claimed is:

1. A gas composition for anisotropically etching refractory metal silicide comprising principally a mixture of $Cl_2$, $BCl_3$ and HCl and further comprising a small amount of dopant gas not exceeding twenty volume percent of the total gas, selected from fluorine-containing gas, oxygen, and a mixture of fluorine-containing gas and oxygen, for providing a high etch selectivity to organic photoresist masks and a high etch rate ratio of silicide to polysilicon.

2. The gas composition of claim 1, wherein the fluorine-containing gas is selected from $CF_4$ and $NF_3$.

3. The etching gas composition of claim 1, wherein the dopant gas is a mixture of oxygen and $CF_4$ containing at least 90 percent by volume $CF_4$.

4. The etching gas composition of claim 1, wherein the dopant gas is $NF_3$, for etching tungsten silicide.

5. The etching gas composition of claim 1, wherein the dopant gas is $CF_4$, for etching tungsten silicide.

6. The etching as composition of claim 1, wherein the dopant gas is oxygen, for etching molybdenum silicide.

7. The etching gas composition of claim 1, wherein the volumetric flow ratios of $HCl:BCl_3:Cl_2$ are $(40-75):(80-40):(60-40)$.

8. The etching gas composition of claim 7, wherein the etching gas mixture comprises $HCl:BCl_3:Cl_2$:fluorinated etching gas in the volumetric flow ratio of about 75:40:40:20.

9. The etching gas composition of claim 8, wherein the reactive gas mixture comprises $HCl:BCl_3:Cl_2$:oxygen in a volumetric flow rate of about 75:40:40:(5-10).

* * * * *